(12) United States Patent
McGinn

(10) Patent No.: US 11,651,928 B2
(45) Date of Patent: May 16, 2023

(54) REENTRANT GAS SYSTEM FOR CHARGED PARTICLE MICROSCOPE

(71) Applicant: FEI Company, Hillsboro, OR (US)

(72) Inventor: James B McGinn, Hillsboro, OR (US)

(*) Notice: Subject to any disclaimer, the term of this patent is extended or adjusted under 35 U.S.C. 154(b) by 129 days.

(21) Appl. No.: 17/364,717

(22) Filed: Jun. 30, 2021

(65) Prior Publication Data

US 2023/0005697 A1    Jan. 5, 2023

(51) Int. Cl.
*H01J 37/08*    (2006.01)
*H01J 37/02*    (2006.01)
*H01J 37/26*    (2006.01)

(52) U.S. Cl.
CPC ............ *H01J 37/026* (2013.01); *H01J 37/08* (2013.01); *H01J 37/26* (2013.01)

(58) Field of Classification Search
CPC .......... H01J 37/08; H01J 37/26; H01J 37/026; H01J 37/077
See application file for complete search history.

(56) References Cited

U.S. PATENT DOCUMENTS

| | | | |
|---|---|---|---|
| 6,515,290 B1 * | 2/2003 | Rzeszut | H01J 37/08 250/492.21 |
| 2008/0220596 A1 * | 9/2008 | Olander | H01J 27/02 257/E21.334 |

* cited by examiner

*Primary Examiner* — David E Smith
*Assistant Examiner* — Hsien C Tsai

(57) ABSTRACT

Disclosed herein are apparatuses and systems for reentrant fluid delivery techniques. An example system includes at least a fluid delivery conduit extending between first and second electrical potentials, wherein the fluid delivery conduit is formed into a tilted helical so that a fluid flowing through the fluid delivery conduit experiences an electric field reversal through each winding of the fluid delivery conduit.

20 Claims, 5 Drawing Sheets

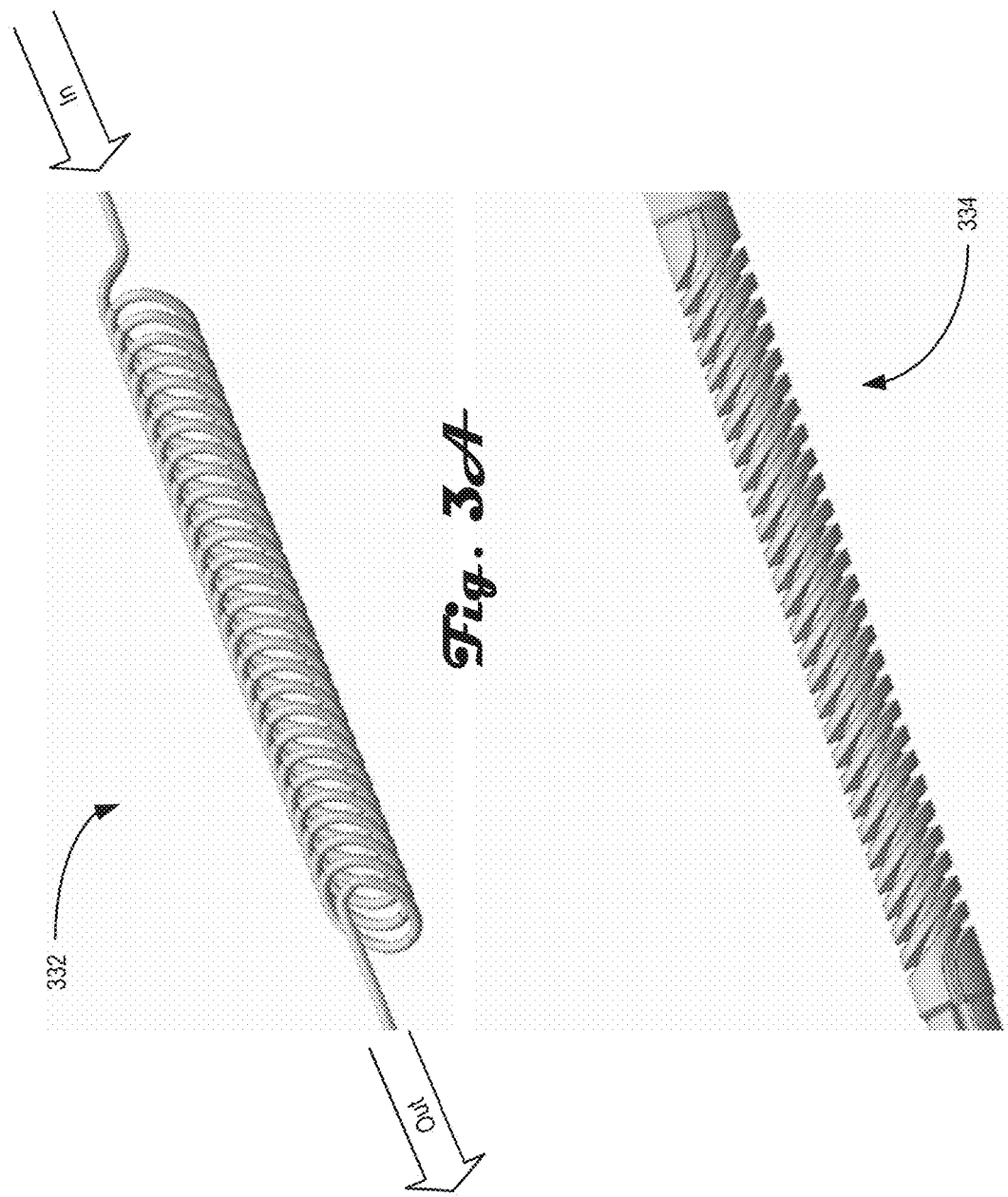

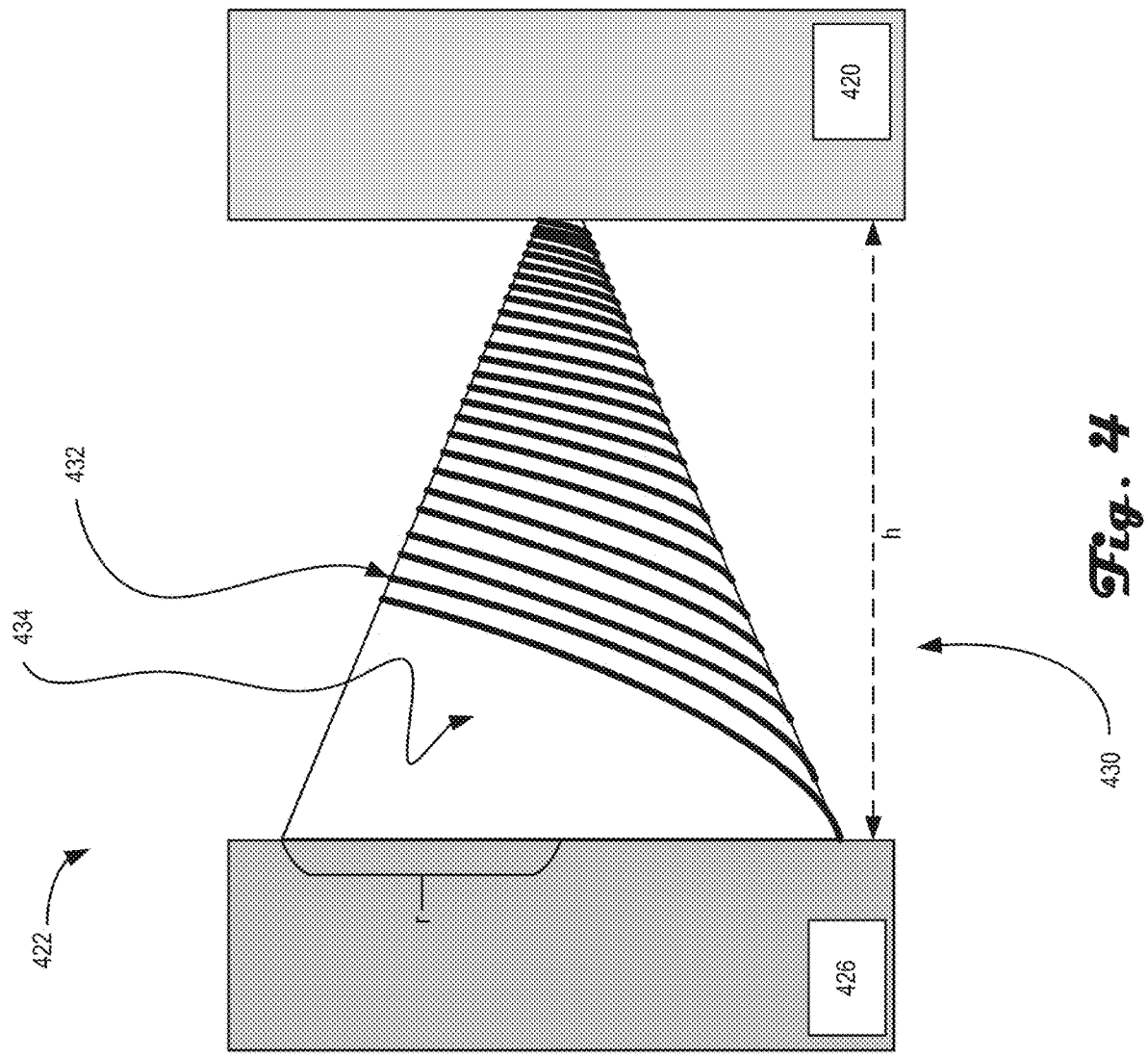

REENTRANT GAS SYSTEM FOR CHARGED PARTICLE MICROSCOPE

FIELD OF THE INVENTION

The invention relates generally to gas delivery techniques for charged particle microscopes, and specifically to reentrant gas delivery systems that deliver a gas from a low voltage potential to a high potential that allow for flexible design while minimizing or eliminating gas breakdown due to high electric fields.

BACKGROUND OF THE INVENTION

Many industrial and high technology areas use gas systems to process materials. In some of these systems, the gas may be delivered from ground or low voltage to a high voltage where the gas is used to form a plasma, for example. Delivery of gases in such systems may need to adhere to strict constraints to avoid undesirable effects, such as gas breakdown in the delivery system. While these constraints help reduce or prevent such breakdown, they also reduce the flexibility in designing gas delivery systems. As such, alternative gas delivery techniques are desired that provide greater design flexibility while still providing gas breakdown reduction/prevention.

SUMMARY

Disclosed herein are apparatuses and systems for reentrant fluid delivery techniques. An example system includes at least a fluid delivery conduit extending between first and second electrical potentials, wherein the fluid delivery conduit is formed into a tilted helical so that a fluid flowing through the fluid delivery conduit experiences an electric field reversal through each winding of the fluid delivery conduit.

Another example system at least includes a focused ion beam column coupled to receive a gas and generate a focused ion beam with or from the gas, wherein the focused ion beam column that receives the gas at a second electrical potential; and a gas delivery system coupled to provide the gas to the focused ion column, the gas being at a first electrical potential at a first location in the gas delivery system. The gas delivery system at least including a fluid delivery conduit extending between the first and second electrical potentials, wherein the fluid delivery conduit is formed into a tilted helical so that a fluid flowing through the fluid delivery conduit experiences an electric field reversal through each winding of the fluid delivery conduit.

BRIEF DESCRIPTION OF THE DRAWINGS

FIG. 3A is an example gas conduit in accordance with an embodiment of the present disclosure;

FIG. 3B is an example mandrel in accordance with an embodiment of the present disclosure;

FIG. 4 is an example reentrant system in accordance with an embodiment of the present disclosure;

Like reference numerals refer to corresponding parts throughout the several views of the drawings.

DETAILED DESCRIPTION OF EMBODIMENTS

Figure 1:
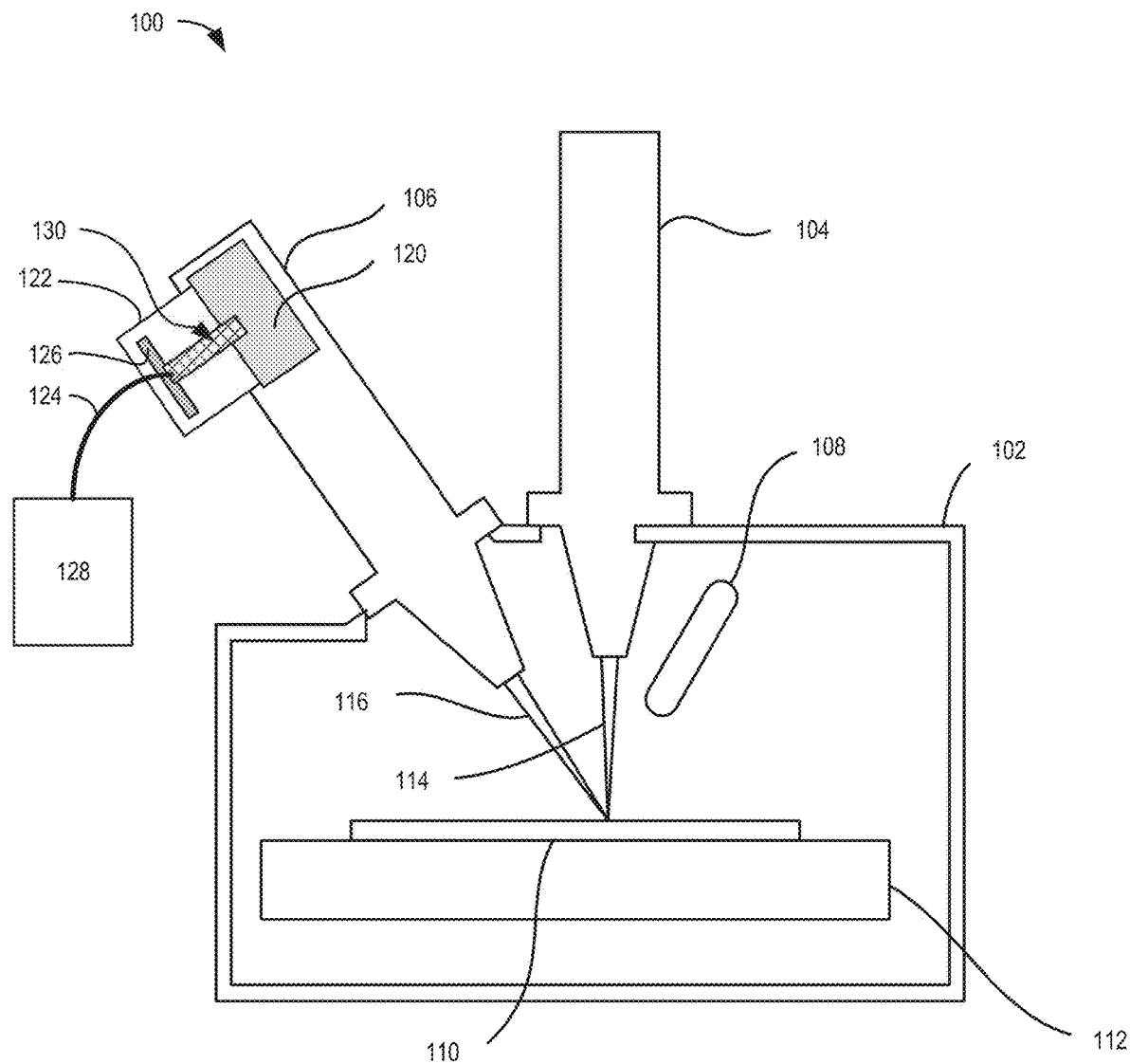
FIG. 1 is an example dual beam microscope including a reentrant gas delivery system in accordance with one or more embodiments of the present disclosure.

Embodiments of the present invention are described below in the context of a charged particle microscope including a reentrant gas delivery system for providing a gas from low voltage to a high voltage where the reentrant gas system reduces gas breakdown progressing through the system while providing flexible design. For example a mandrel with a gas conduit wound around in it in a tilted, helical shape provides a path for a fluid that experiences numerous field reversals that can arrest a gas breakdown from propagating through the conduit. Such a gas delivery system allows for flexible conduit design, which includes length and shape. However, it should be understood that the techniques described herein are generally applicable to a wide range of gas delivery systems and apparatuses, and are not limited to any particular apparatus type disclosed herein.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatuses, and methods described herein should not be construed as limiting in any way. Instead, the present disclosure is directed toward all novel and non-obvious features and aspects of the various disclosed examples, alone and in various combinations and sub-combinations with one another. The disclosed systems, methods, and apparatuses are not limited to any specific aspect or feature or combinations thereof, nor do the disclosed systems, methods, and apparatuses require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatuses can be used in conjunction with other systems, methods, and apparatuses. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

There are many industrial applications that require a gas for establishing a processing medium, such as a plasma or an ion beam, both focused and broad. Such applications may provide gas to a chamber or components that are at a high potential, such as 10's of kilovolts. Such gas, however, is usually at a much lower voltage before arriving at the high voltage regions, and this change in potential can cause problems, such as gas breakdown within the delivery system. If the gas breaks down in transit, the breakdown may cause a cascade effect that allows the breakdown to progress through all the gas within the delivery system. Such breakdown can cause process interruptions, equipment failure and bodily harm to nearby personnel. Gas breakdown is well understood and generally described by the Pachen curves for various gases. It is generally understood by those who practice that the Pachen curves give guidance for the minimum gas conduit length to prevent gas breakdown for a given delivery voltage. Unfortunately, for high voltage applications this requires long delivery lines, especially with gases delivered at low pressures, where such solution provides little flexibility in design—both physical and operating parameters. As such, new solutions are desired.

One technique to address this problem is a reentrant gas delivery system where any fluid progressing through the system experiences multiple electric field reversals, which provide an arresting force to any breakdown that occurs. The reentrant gas system may be provided with a conduit that is formed into a tilted helical shape, where each winding of the helix includes both a forward progression and a backward progression. The conduit is formed such that, for a simple analogy, the fluid takes two steps forward and one step back with each winding. Such a system allows for design flexibility since the overall shape of the conduit can be compressed and variable. For example, the shape could be cylindrical or conical. Such flexibility allows designers to design with fewer constraints.

FIG. 1 is an example dual beam microscope 100 including a reentrant gas delivery system in accordance with one or more embodiments of the present disclosure. The microscope 100 can be used to image and prepare samples using a focused ion beam that is provided a gas by the reentrant gas delivery system. The reentrant gas delivery system reduces or eliminates some gas breakdown mechanisms along with providing flexibility of gas delivery design.

Microscope 100 includes an electron column 104, a plasma-based focused ion beam (PFIB) column 106, a moveable stage 112 and a detector 108 all encased or coupled to vacuum chamber 102. Electron column 104 is a scanning electron column (SEM) in some examples, but can be omitted in other examples such that microscope 100 only incudes a PFIB column. The electron column 104 provides an electron beam 114 to a sample 110 disposed on stage 112 to image a surface of the sample 110. Detector 108 detects secondary and/or backscattered electrons emitter or reflected from sample 110 in response to electron beam 114.

PFIB column 106 generates and directs ion beam 116 toward the sample 110 for imaging and/or processing the sample. For imaging, detector 108 detects secondary and/or backscattered electrons emitter or reflected from sample 110 in response to ion beam 116. In some examples, ion beam 116 can interact with precursor gases present at the surface of sample 110 to etch the sample or deposit materials on the surface of the sample. Such precursor gases may be provided by a gas injection system, not shown, as is known in the art.

PFIB 106 includes a plasma-based ion source 120 that receives one or more gases from gas storage 128. The one or more gases interact with a generated plasma to form ion beam 116. The one or more gases can be reactive, nonreactive or a mixture thereof. Gas from gas storage 138 are provided to reentrant gas delivery system 122 via piping/tubing 124. The gas is typically received by the reentrant gas delivery system at a ground potential, but the ion source 120 is typically at 10's of kilovolts. This change in potential can sometimes cause the gas to breakdown, which can be reduced or eliminated by the reentrant gas system 122.

Reentrant gas system 122 includes reentrant gas conduit 130, conduit 130 for short, supported by structure 126 and ion source 120. In general, the reentrant gas conduit 130 includes a conduit formed into a tilted helical shape so that each turn of the helix is tilted such that each turn comes back part of the distance it progresses. As used herein, reentrant implies that fluids delivered by the conduit advance from one end to the other through a path that proceeds forward and backward in voltage by differing amounts or lengths per a winding of the tilted helical shape. As used herein, the fluid advances from low to high voltage via successively advancing an amount in voltage, and re-entering, by a smaller amount in voltage, then advancing to a yet greater amount of voltage, followed by the appropriate smaller re-entrant step, and etc. In some examples, the amount of forward and backward progression may be determined based on the strength of the electrical field the conduit is progressing, where the electric field establishes a gradient of equipotential lines between two electrodes. For example, the path may provide for the fluid to advance through X number of equipotential lines and back Y number of equipotential lines during one turn/winding of the tilted helix, where Y is less than X. In some examples, X is 2 and Y is 1, but other combinations are contemplated herein and covered by this disclosure. In general, the path, which may relate to the angle of the tilt, may be based on the strength of the gradient, where a higher gradient may increase the difference between X and Y, whereas a lower gradient may lessen that difference. By causing the gas to go backward and forward through lines of equipotential, the gas inside experiences at least one field reversal. Another example includes that when equipotential lines are established between two electrical potentials, and where each winding of the fluid delivery conduit advances through at least two equipotential lines and returns by at least one equipotential line progressing via adaptive form along any shape of equipotential lines. The field reversal allows for reduction or elimination of the potential for gas breakdown when progressing from low voltage potential, e.g., ground, to high voltage potential, e.g., ~35 kV. Additionally, the tilted helical shape also provides for flexibility in designing and sizing the reentrant gas delivery system 122.

Figure 2:
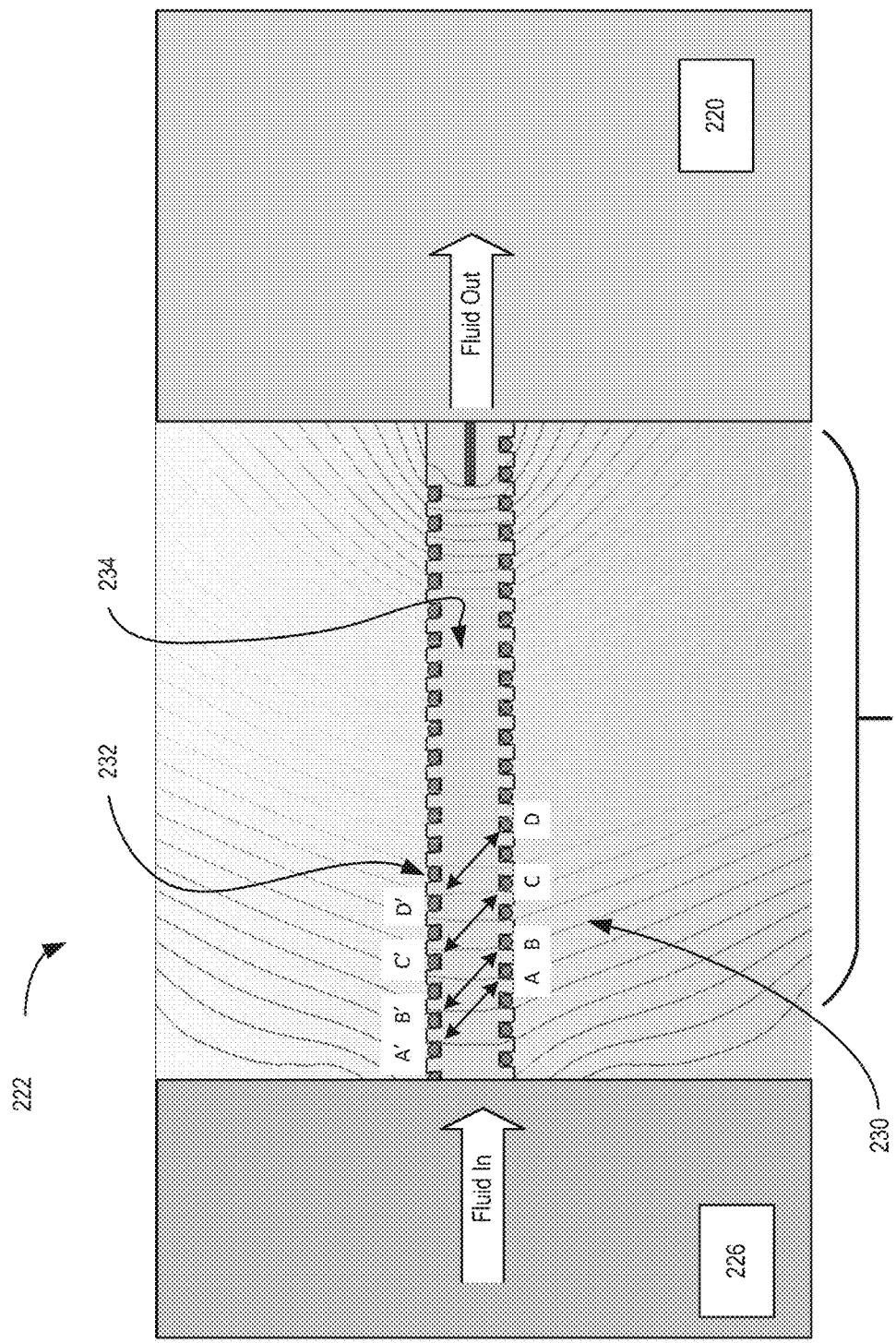
FIG. 2 is an example reentrant system in accordance with an embodiment of the present disclosure.

In some examples, conduit 130 may be wound around a support mandrel or other shaped structure, see FIGS. 2 and 4 for examples, where the support structure extends between support 126 and ion source 120. The support mandrel can be a rod formed from insulating material with grooves formed on the external surface for holding the conduit 130. Besides the rod-shaped mandrel, the support structure can have a conical shape of varying height to radius ratios.

FIG. 2 is an example reentrant system 222 in accordance with an embodiment of the present disclosure. The reentrant gas system 222, or system 222 for short, is an example of reentrant gas system 122. System 222 provides a fluid, such as a gas, from a low voltage potential to a higher voltage potential while reducing or eliminating the chance of fluid breakdown due to high voltage fields while providing flexibility in design and sizing. Although system 222 may be used in a microscope setting, system 222 may be used in any system that uses gases at a high voltage but are provided to the high voltage components from a lower voltage. An example system being a plasma arc-welding system.

System 222 includes support 226, electrode 220, and reentrant gas conduit 230, or conduit 230 for short. Support 226 may provide physical support for conduit 230, and may be conductive in some examples such that it may behave as an electrode. Electrode 220 may be part of a high voltage ion or plasma generation system being provided a gas by conduit 230. In some examples, support 226 may be at a lower voltage, e.g., ground, than electrode 220, which may be at 10's of kV. For example electrode 220 can be at a voltage in the range from 10 kV to 60 kV. Due to the voltage difference between support 226 and electrode 220, an electric field is generated forming equipotential lines 236. The rate of change of the electric field and the spacing and potential values of the equipotential lines are established by the distance between support 226 and electrode 220 and their relative voltage levels.

Conduit 230 is formed from mandrel 234 and gas conduit 232. Mandrel 234 is rod-shaped, as the term mandrel suggests, and can be made from insulating materials. Additionally, mandrel 234 may have grooves formed in the external surface sized to receive conduit 232. The grooves are optional and may be used to retain the conduit 232 in the desired location and shape. Conduit 232 may be formed from flexible tubing that can be wound around mandrel 234 in the desired radius of curvature. Additionally, conduit 232 may be formed from a material that will not degrade from the gas or fluids being delivered therethrough. Alternatively, the grooves formed in mandrel 234 may be encapsulated so that the grooves themselves form the conduit 232, or the conduit 232 can be cast into the mandrel 234. Additionally, conduit 232, once formed via mandrel 234 can be used independently of mandrel 234. Further, conduit 232 used independently of mandrel 234 can be used to deliver a gas to a moving electrode where for example the spacing between electrode 226 and electrode 220 changes dynamically. Any of these options are possible and the use of separate conduit and mandrel is for illustrative purposes only and not limiting to the techniques disclosed herein.

As discussed above regarding reentrant systems, conduit 232 is wound around mandrel 234 in a tilted, helical shape so that as a fluid flowing through the conduit 232 progresses from in to out, the fluid progresses forward a distance then back a portion of that distance in one winding before beginning the next winding. For example, if a fluid enters winding A (in a direction toward the page), then the fluid will come out at location A', which is two pitches behind A. A pitch as used herein is the distance between adjacent grooves in mandrel 234. The pitch, or more specifically, the number of pitches the conduit travels in each winding, is based on the distance between adjacent equipotential lines 236. To continue the example, fluid entering point B will come out at B', same for C and C' and D and D'. As such, fluids progressing through conduit 232 advance through two or more equipotential lines and return by one equipotential line per winding. This process of moving up the potential and back per widening causes the fluid in conduit 232 to experience an electric field reversal in each winding, which helps arrest or prevent fluid breakdown in high electric field applications. The two to one equipotential change is only an example and other variations are contemplated herein. It should also be noted that conduit 232 can be used without the mandrel 234, which is used to provide physical support to the conduit.

FIG. 3A is an example gas conduit 332 in accordance with an embodiment of the present disclosure. Conduit 332 illustrates the tilted, helical shape of conduit 232, which can be used as a reentrant gas conduit. As seen in FIG. 3A, the conduit 332 is in a view that is turned from that shown in FIG. 2, as indicated by the in and out arrows.

FIG. 3B is an example mandrel 334 in accordance with an embodiment of the present disclosure. Mandrel 334 illustrates the grooves, their spacing and amount of tilt so that a conduit wound thereon would provide the desired field reversal for a given range of equipotential spacings.

FIG. 4 is an example reentrant system 422 in accordance with an embodiment of the present disclosure. System 422 is similar to system 222 in many ways, such as support 426, electrode 420, etc., which will not be discussed again for sake of brevity. System 422 includes a support structure 434 around with conduit 432 is wound. In contrast to mandrel 234, support structure 434 is conical shaped having a radius r and a height h. different ratios of h and r can be used to design the length, base width and angle of the cone to provide design flexibility.

Figure 5A:
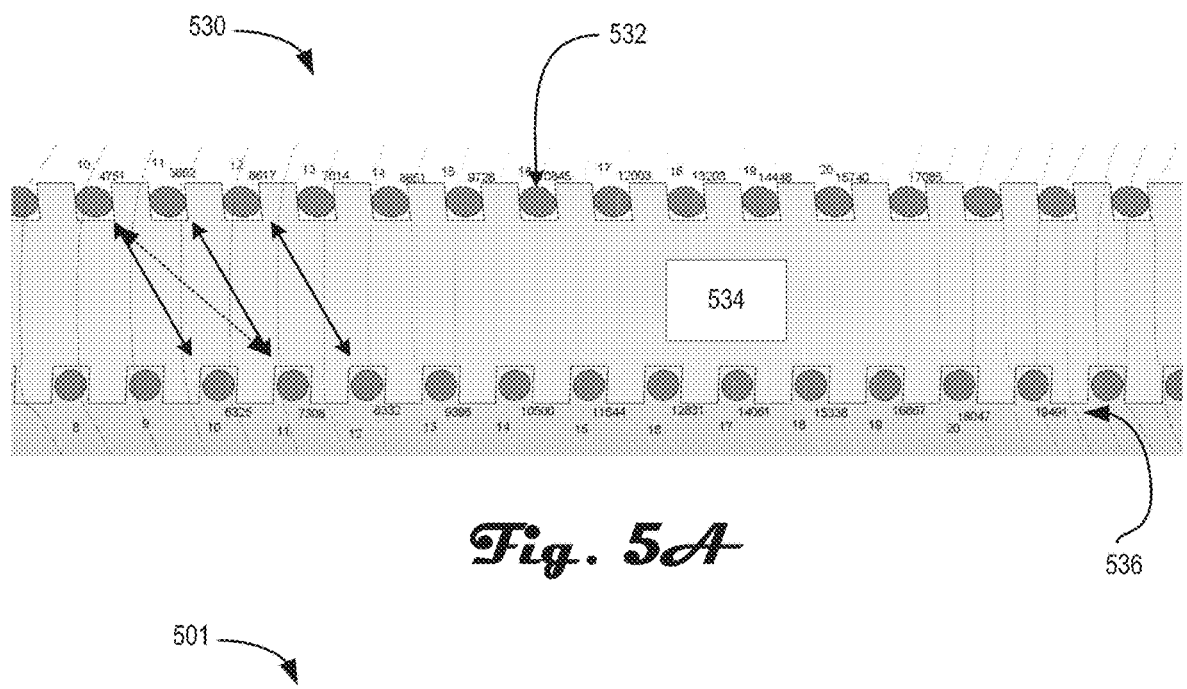
FIG. 5A is an example reentrant gas delivery conduit in accordance with an embodiment of the present disclosure.

FIG. 5A is an example reentrant gas delivery conduit 530 in accordance with an embodiment of the present disclosure. Conduit 530 is a detailed version of conduit 230, which shows cells 8 through 20 and voltage levels of equipotential lines 236. The cell numbers indicate related winding positions on the top and bottom of mandrel 534 where conduit 532 is placed. As can be seen in FIG. 5A, each winding, as indicated by matching top and bottom cell numbers, are separated by at least two equipotential lines 536. Additionally, as one winding transitions to a subsequent winding, the change from top cell 10, for example, to bottom cell 11 shows that conduit 532 progresses through three to four equipotential lines before returning through two equipotential lines at top cell 11. This repeated forward and backward progression though equipotential lines establishes the field reversal.

Figure 5B:
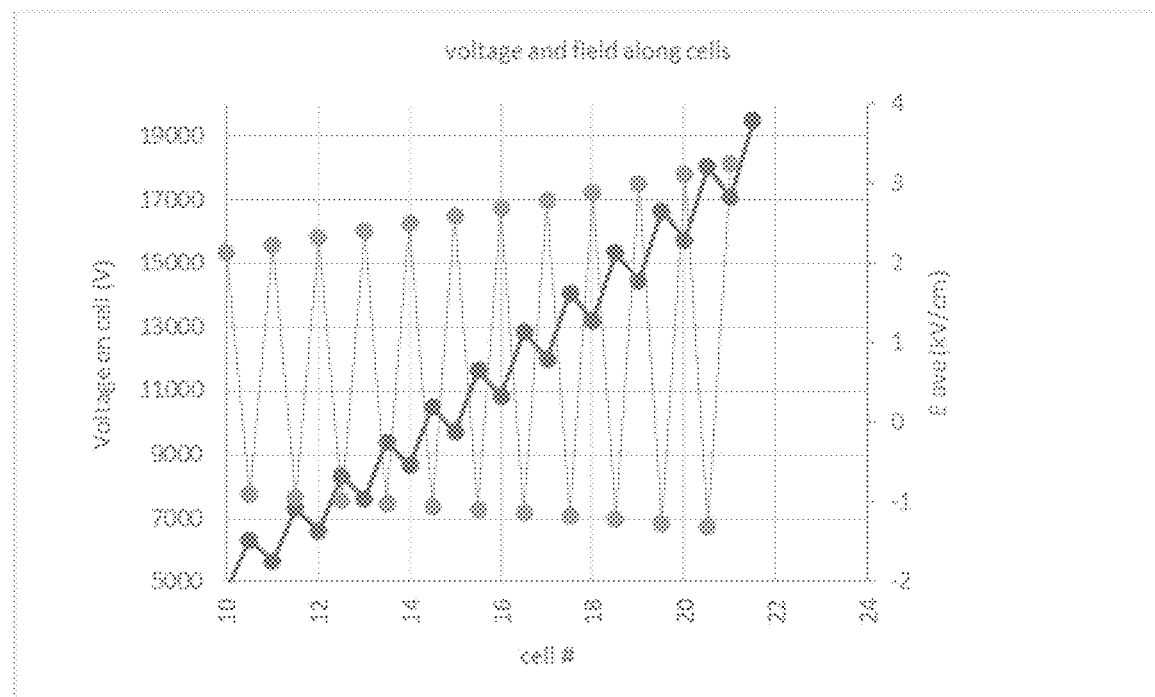
FIG. 5B in an example plot showing the change in overall potential and the filed reversals of gas delivery conduit in accordance with an embodiment of the present disclosure.

FIG. 5B in an example plot 501 showing the change in overall potential and the filed reversals of gas delivery conduit 530 in accordance with an embodiment of the present disclosure. The left axis shows the voltage on cell as the conduit 532 progresses from 5 kV to ~19 kV. As can be seen the voltage change from cell 10 to cell 20 shows a stairstep pattern as the cells progress forwards and backwards through the equipotential lines. The right axis shows the electric field reversals as the conduit 532 progresses between the same potentials. As shown, each cell experiences an electric field change from ~−1 kV/cm to ~3 kV/cm.

The embodiments discussed herein to illustrate the disclosed techniques should not be considered limiting and only provide examples of implementation. For example, the conduit can be wound around any shaped structure, such as pyramidal, share, hexagonal, so long as the field reversals occur to any fluid flowing therethrough. Those skilled in the art will understand the other myriad ways of how the disclosed techniques may be implemented, which are contemplated herein and are within the bounds of the disclosure.

What is claimed is:

1. A fluid delivery system comprising:
  a fluid delivery conduit extending between first and second electrical potentials, wherein the fluid delivery conduit is formed into a tilted helical so that a fluid flowing through the fluid delivery conduit experiences an electric field reversal through each winding of the fluid delivery conduit.

2. The fluid delivery system of claim 1, further including a mandrel extending between first and second electrodes, wherein the fluid delivery conduit winds around the mandrel, and wherein the first and second electrodes are at the first and second electrical potentials.

3. The fluid delivery system of claim 2, wherein the mandrel is rod-shaped.

4. The fluid delivery system of claim 2, wherein grooves are formed in the mandrel, the grooves arranged so that the fluid delivery conduit fits within the grooves.

5. The fluid delivery system of claim 1, wherein the first electrical potential is a low voltage and the second electrical potential is a high voltage.

6. The fluid delivery system of claim 5, wherein the low voltage is ground and the high voltage is in the range from 10 kV to 50 kV.

7. The fluid delivery system of claim 1, further including a cone-shaped support structure extending between first and second electrodes, wherein the fluid delivery conduit winds around the cone-shaped support structure.

8. The fluid delivery system of claim 1, wherein equipotential lines are established between the first and second electrical potentials, and wherein each winding of the fluid delivery conduit advances through at least two equipotential lines and returns by at least one equipotential lines.

9. The fluid delivery system of claim 8, wherein equipotential lines are established between the first and second electrical potentials, and wherein each winding of the fluid delivery conduit advances through at least two equipotential lines and returns by at least one equipotential line progressing via adaptive form along any shaped of equipotential lines.

10. The fluid delivery system of claim 1, wherein the fluid delivery conduit is disposed in an charged particle column.

11. The fluid delivery system of claim 10, wherein the charged particle column is a plasma focused ion beam column.

12. A system comprising:
a focused ion beam column coupled to receive a gas and generate a focused ion beam with or from the gas, wherein the focused ion beam column that receives the gas at a second electrical potential; and
a gas delivery system coupled to provide the gas to the focused ion column, the gas being at a first electrical potential at a first location, the gas delivery system including:
a fluid delivery conduit extending between the first and second electrical potentials, wherein the fluid delivery conduit is formed into a tilted helical so that a fluid flowing through the fluid delivery conduit experiences an electric field reversal through each winding of the fluid delivery conduit.

13. The system of claim 12, wherein the gas delivery system further includes a mandrel extending between first and second electrodes, wherein the fluid delivery conduit winds around the mandrel, and wherein the first and second electrodes are at the first and second electrical potentials.

14. The system of claim 13, wherein grooves are formed in the mandrel, the grooves arranged so that the fluid delivery conduit fits within the grooves.

15. The system of claim 12, wherein the first electrical potential is a low voltage and the second electrical potential is a high voltage.

16. The system of claim 15, wherein the low voltage is ground and the high voltage is in the range from 10 kV to 50 kV.

17. The system of claim 12, wherein the gas delivery system further includes a cone-shaped support structure extending between first and second electrodes, wherein the fluid delivery conduit winds around the cone-shaped support structure.

18. The system of claim 12, wherein equipotential lines are established between the first and second electrical potentials, and wherein each winding of the fluid delivery conduit advances through at least two equipotential lines and returns by at least one equipotential line progressing via adaptive form along any shaped of equipotential lines.

19. The system of claim 12, wherein the focused ion beam column is part of a dual beam charged particle microscope.

20. The system of claim 12, further including a gas container coupled to the gas delivery system, the gas container storing the gas.

* * * * *